United States Patent [19]

Rha

[11] Patent Number: 5,552,614
[45] Date of Patent: Sep. 3, 1996

[54] SELF-ALIGNED THIN FILM TRANSISTOR WITH SIDEWALL SPACERS

[75] Inventor: Sa K. Rha, Seoul, Rep. of Korea

[73] Assignee: LG Semicon Co., Ltd., Tokyo, Japan

[21] Appl. No.: 353,446

[22] Filed: Dec. 9, 1994

Related U.S. Application Data

[62] Division of Ser. No. 233,070, Apr. 26, 1994, Pat. No. 5,403,761.

[30] Foreign Application Priority Data

Jun. 21, 1993 [KR] Rep. of Korea ............... 11324/1993

[51] Int. Cl.$^6$ .................... H01L 29/76; H01L 27/01
[52] U.S. Cl. .................... 257/66; 257/69; 257/71; 257/347; 257/348
[58] Field of Search .................. 257/66, 67, 69–71, 257/74, 347, 348, 352

[56] References Cited

U.S. PATENT DOCUMENTS

| | | | |
|---|---|---|---|
| 4,628,589 | 12/1986 | Sundaresan | 437/34 |
| 4,656,731 | 4/1987 | Lam et al. | 437/57 |
| 4,916,508 | 4/1990 | Tsukamoto et al. | 257/66 |
| 5,173,754 | 12/1992 | Manning | 257/69 |
| 5,198,379 | 3/1993 | Adan | 437/41 |
| 5,262,655 | 11/1993 | Ashida | 257/66 |
| 5,300,446 | 4/1994 | Fujikoa | 437/41 |
| 5,311,040 | 5/1994 | Hiramatsu et al. | 257/69 |
| 5,403,761 | 4/1995 | Rha | 437/40 |

FOREIGN PATENT DOCUMENTS

| | | | |
|---|---|---|---|
| 1-293566 | 11/1989 | Japan | 257/347 |
| 4-139881 | 5/1992 | Japan | 257/66 |
| 5-167072 | 7/1993 | Japan | 257/347 |

OTHER PUBLICATIONS

"16Mbit SRAM Cell Technologies for 2.0V Operation" by H. I. Ohkubo et al, VLSI Development Division, LSI memory Division, NEC Corporation, Sagamihara, Kangagawa 229, Japan, published by IEEE, 1991.

*Primary Examiner*—Mahshid Saadat
*Attorney, Agent, or Firm*—Morgan, Lewis and Bockius LLP

[57] ABSTRACT

This invention relates to the Thin Film Transistor having the self-aligned diffused source/drain regions for improving the ratio of on to off current and the method of fabricating the same. The method of making TFT comprising the steps of forming a gate electrode around a central portion of a substrate, forming a gate insulating layer over the substrate and covering the gate electrode, forming a semiconductor layer on the gate insulating layer, forming sidewall spacers on stepped potions of the first semiconductor layer near both sides of the gate electrode, forming a doped semiconductor layer over the whole surface of the substrate, patterning the second semiconductor layer to form one of the patterned second semiconductor layers formed over the first semiconductor layer and apart from the one sidewall spacer near one side of the gate electrode, and the other formed over the first semiconductor layer and the other sidewall spacer near the other side of the gate electrode, and diffusing the impurity in the second semiconductor layer through the anneal process to form highly doped impurity regions in the underlying first semiconductor layer.

11 Claims, 6 Drawing Sheets

SELF-ALIGNED THIN FILM TRANSISTOR WITH SIDEWALL SPACERS

CROSS REFERENCE TO RELATED APPLICATION

This is a divisional of application Ser. No. 08/233,070, filed Apr. 26, 1994, now U.S. Pat. No. 5,403,761.

FIELD OF THE INVENTION

This invention relates to a Thin Film Transistor and method of making the same, more particularly, to the Thin Film Transistor which is applicable to the high density device and has the self-aligned diffused source/drain regions and the bottom gate, and the method of fabricating the same.

BACKGROUND OF THE INVENTION

Generally, a Thin Film Transistor(hereinafter referred to as TFT) is used as not only a load resistor in the high density Static Random Access Memory (SRAM), but also a driving means for Liquid Crystal Display.

In SRAM with memory capacities of the mega-bit, the reduced cell size and lowered supply voltage make it lower the potential level of the cell node which stores the information data '1', which results in the instability in operation of the cell as a severe problem.

One of the methods for solving such a problem is to adopt an access transistor having the large size ratio (WD/LD)/(WA/LA) like a driver transistor, thereby increasing the cell ratio.

However, the solution is not suitable for the high density SRAM in that the cell size must be reduced.

There is another solution that as a load resistor the polysilicon TFT is employed instead of the polysilicon resistor in order to have the characteristics of the high charging current and low leakage current.

However, a problem arises in that a ratio of on to off current is not high enough to apply the polysilicon TFT to SRAM with memory capacities of 16 Mb.

Recently, there is provided a Lightly Doped Offset TFT (LDO TFT) which can be well adopted in a high density SRAM, which is disclosed in detail in the article of H. Ohkubo et al., 16 Mbit SRAM Cell Technologies for 2.0V Operation, IEDM.Tech.Dig., pp 481–484, 1991.

FIG. 1 is a sectional view of the conventional LDO TFT having a bottom gate.

Referring to FIG. 1, the conventional LDO TFT includes a substrate 11, an insulating layer 12 formed over the substrate 11, a gate 13 formed around a central portion of the insulating layer 12, a gate insulating layer 14 formed over the insulating layer 12 and covering the exposed whole surface of the gate 13, a semiconductor layer 15 formed over the gate insulating layer 14, a lightly doped p type impurity region 19 in the semiconductor layer 15 and near one side of the gate 13, and a highly doped p type impurity region 22 in the semiconductor layer 15 except for the gate 13 and p type impurity region 19.

The conventional LDO TFT has a bottom gate formed underneath the semiconductor layer 15, the source region in the semiconductor layer 15 and near one side of the gate 13, the source region including a single heavy p type impurity region 22, and the drain region in the semiconductor layer 15 and near other side of the gate 13, the drain region including a heavy p type impurity region 19 and a heavy p type impurity region 22 adjacent to the heavy p type impurity region 19.

FIGS. 2A through 2C are sectional views explaining the processing steps of making LDO TFT having the bottom gate.

As shown in FIG. 2A, the substrate 11 has the insulating layer 12 such as oxide layer on which a layer of polysilicon is deposited. The polysilicon layer is then patterned to form a gate located in the central portion of the insulating layer 12.

Over the whole surface of the substrate is formed a High Temperature Oxide layer 14 as the gate insulating layer on which a polysilicon layer is then deposited to form a semiconductor layer 15 followed by the Si ion implant so as to improve the feature of the semiconductor layer 15.

Through Si ion implant, the polysilicon layer is converted into the amorphous silicon layer, but the converted layer is subjected to the thermal treatment at the temperature of 600°±50° C. to form a polysilicon layer again, wherein the annealing can be performed by either a laser or an long thermal treatment above 5 hours. Further, one may employ the amorphous silicon layer instead of the polysilicon layer as the semiconductor layer 15. And, the impurity ions 16 are implanted into the semiconductor layer 16 to adjust the threshold voltage VT.

FIG. 2B shows the step of forming a Lightly Doped Drain(LDD) region in a predetermined portion of the semiconductor layer 15, which is formed coating a photoresist film 17 on the semiconductor layer 15 and selectively exposing the surface of the semiconductor layer 15 corresponding to the one side portion of the gate through the photolithographic technique.

The p type impurity ion is implanted towards the exposed surface of the semiconductor layer 15 to form a lightly doped drain area 19 except for the masked area by the patterned photoresist film 17.

FIG. 2C explains the step of forming the off-set source/drain region.

Upon removal the photoresist pattern 17, another photoresist film 20 is coated on the semiconductor layer 15 and through the photolithography the photoresist film is then patterned to expose the surface of the semiconductor layer 15 except for the some portion of the drain region 19 adjacent to the gate and for the portion which corresponds to the top surface portion of the gate 13. The p type impurity ion 21 is implanted towards the exposed surface of the semiconductor layer 15 to form the heavily doped off-set source/drain area 22 except for the masked area by the patterned photoresist film 20.

In general, preferably an off and on current of the TFT has to be low and high as possible, to have a higher ratio of on to off current as a main factor for improving the TFT characteristics.

The conventional off-set TFT has the feature of the reduced off current, but an on current of the device becomes low, which makes a problem of the low on/off current ratio thereby.

In the LDO TFT described above, it is possible to raise the on current, but the off current is higher than that of the off-set TFT, as a result, a ratio of on to off current can not be improved.

While it is necessary to make the semiconductor layer thin in order to reduce the off current of the TFT, the semiconductor layer is made thinner, resulting in the increase in the sheet resistance of the source/drain lines, which leads to the increase in the power consumption amount.

SUMMARY OF THE INVENTION

The object of this invention is to provide a TFT having a self-aligned diffused source/drain and the improved features of a higher ratio of on to off current and reduced power consumption, and the method of fabricating such a TFT.

According to the invention, a Thin Film Transistor(TFT) comprising: a substrate; a gate electrode formed around a central portion of the substrate; a gate insulating layer formed over the substrate and covering the gate electrode; a first semiconductor layer formed on the gate insulating layer; a sidewall spacer formed on both side surfaces of the first semiconductor layer in the vicinity of both sides of the gate electrode; a plurality of highly doped impurity regions in the first semiconductor layer near both sides of the gate electrode, one of the highly doped impurity regions being apart from the sidewall spacer by a certain distance in the vicinity of one side of the gate electrode, and the other region being fully overlapped with the sidewall spacer disposed in the vicinity of the other side of the gate electrode; and a plurality of second semiconductor layers over the first semiconductor layer near both sides of the gate electrode, one of the second semiconductor layers being formed over the first semiconductor layer having one region of the highly doped impurity regions therein, and the other being formed over the first semiconductor layer having the other region of the highly doped impurity regions therein and over the sidewall spacer disposed in the vicinity of the other side of the gate electrode.

In accordance with another object of the invention, a method of fabricating a Thin Film Transistor comprising the steps of forming a gate electrode around a central portion of a substrate; forming a gate insulating layer over the substrate so that the gate insulating layer can cover the gate electrode; forming a first semiconductor layer on the gate insulating layers forming a sidewall spacer on both side surfaces of the first semiconductor layer in the vicinity of one and other sides of the gate electrode; forming a second semiconductor layer over the whole surface of the substrates patterning the second semiconductor layer to form one of the patterned second semiconductor layers which is formed over the first semiconductor layer and apart from the one sidewall spacer by a constant distance in the vicinity of one side of the gate electrode, and simultaneously the other which is formed over the first semiconductor layer and the other sidewall spacer in the vicinity of the other side of the gate electrode; and diffusing the impurity in the second semiconductor layer through the anneal process to form highly doped impurity regions in the underlying first semiconductor layer.

DETAILED DESCRIPTION OF THE INVENTION

Figure 1:
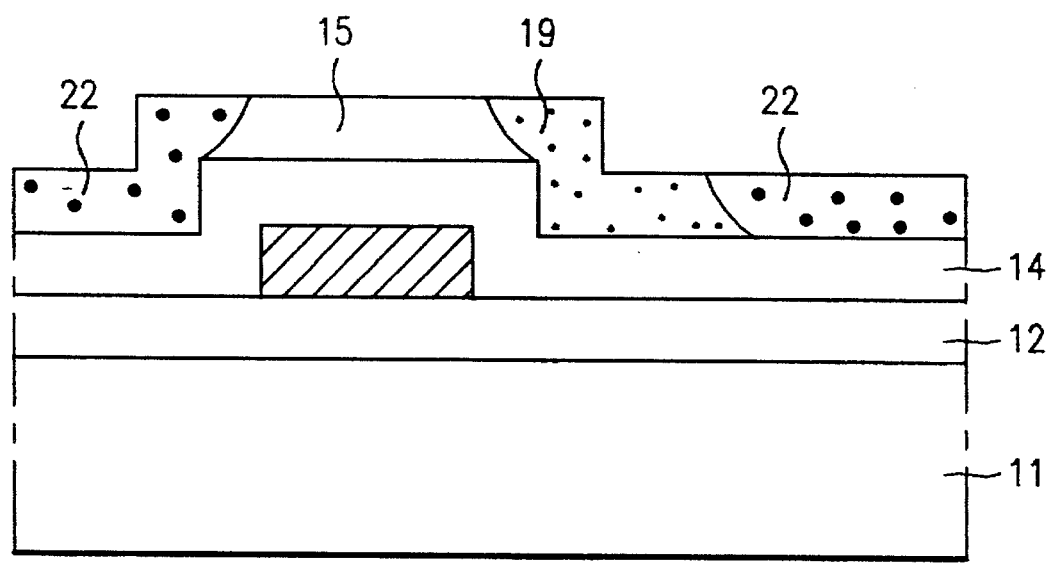
FIG. 1 is a sectional view of the conventional LDO TFT.
Figure 2A:
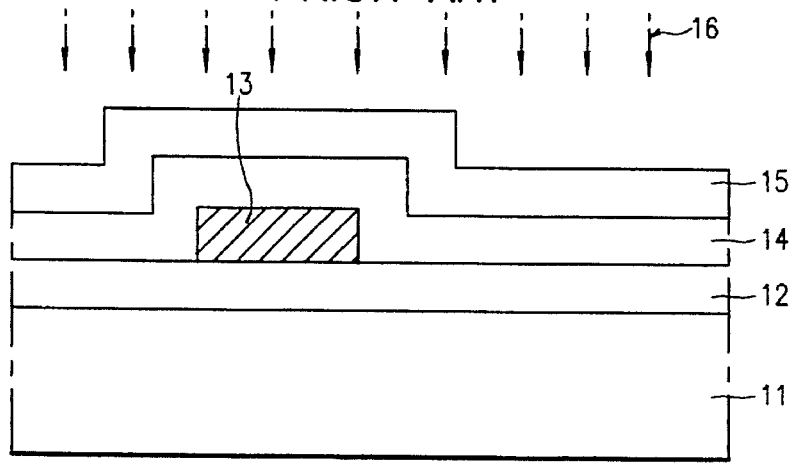
FIGS. 2A through 2C are sectional views explaining the processing steps of making LDO TFT having the bottom gate.
Figure 2B:
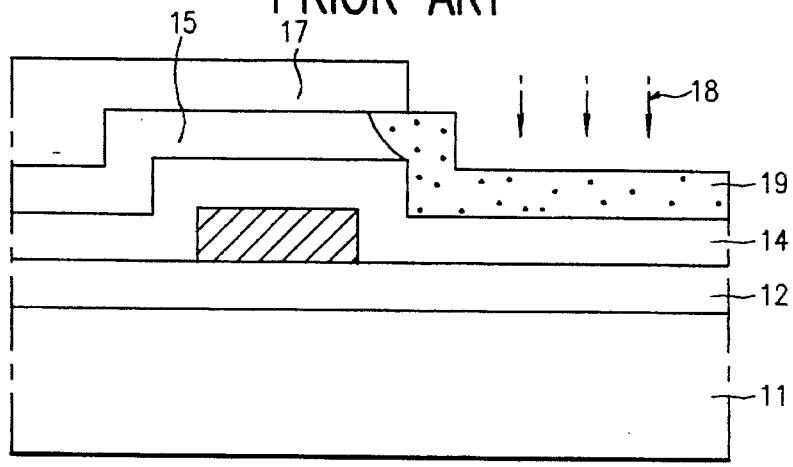
Figure 2C:
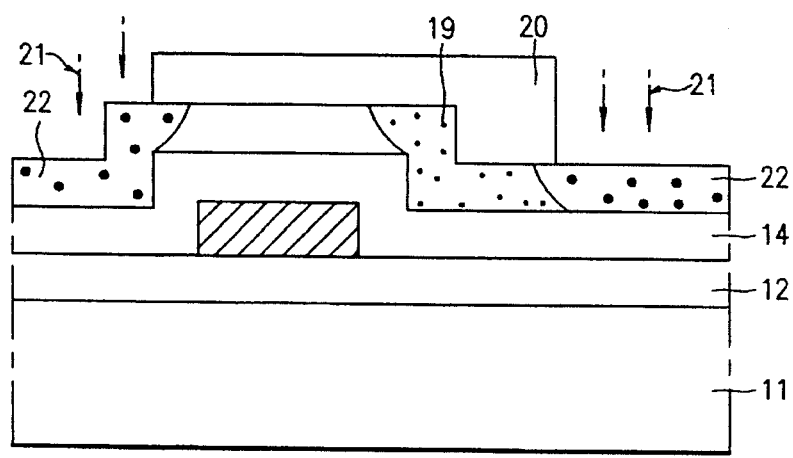
Figure 3:
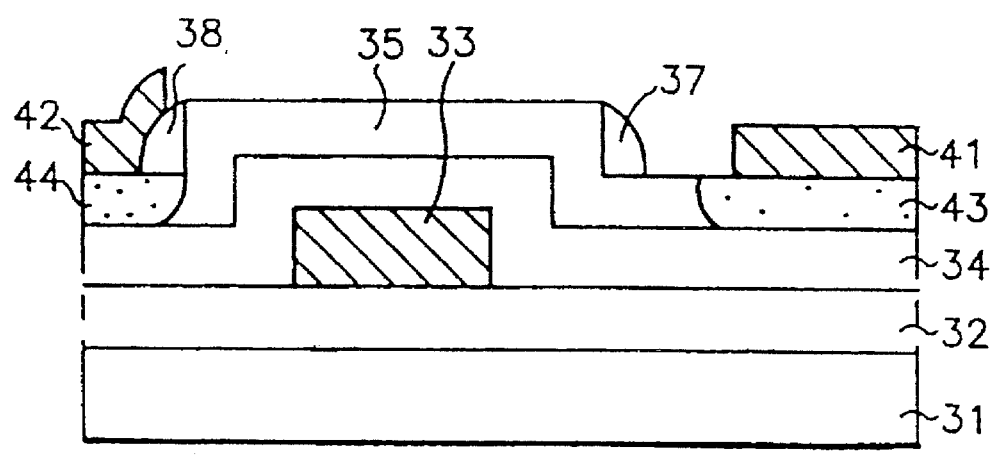
FIG. 3 is a sectional view of the TFT having a self-aligned diffused source/drain according to the preferable embodiment of the invention.

FIG. 3 is a sectional view of the TFT having a bottom gate according to the preferable embodiment of the invention.

Referring to FIG. 3, the TFT comprises a substrate 31, an insulating layer 32 formed over the substrate 31, a gate electrode 33 formed around a central portion of the insulating layer 32, a gate insulating layer 34 formed over the insulating layer 32 and covering the gate electrode 33, a first semiconductor layer 35 formed on the gate insulating layer 34, a sidewall spacer 37,38 formed on both side surfaces of the first semiconductor layer 35 in the vicinity of both sides of the gate electrode 33, a highly doped p type impurity region 43,44 formed in the semiconductor layer 35 in the vicinity of both sides of the gate electrode 33, and a second semiconductor layer 41, 42 formed over the first semiconductor layer 35 having the highly doped p type impurity regions 43,44 therein.

The highly doped p type impurity regions 43,44 correspond to a drain and a source, respectively. The region 43 is apart from the sidewall spacer 37 by a certain distance and formed in the semiconductor layer 35 in the vicinity of one side of the gate electrode 33, and the other region 44 is fully overlapped with the sidewall spacer 38 and formed in the semiconductor layer 35 in the vicinity of the other side of the gate electrode 33.

Also the respective second semiconductor layers 41,42 act as the diffusion source for forming the respective drain and source. The layer 41 is formed over the first semiconductor layer 35 having the highly doped impurity region 43 for the drain therein, and the other layer 42 is formed over the first semiconductor layer 35 having the highly doped impurity region 44 therein and over the sidewall spacer 38.

FIGS. 4A to 4E are sectional views explaining the process steps for making the TFT having a self-aligned diffused source/drain in accordance with the embodiment of the invention.

Figure 4A:
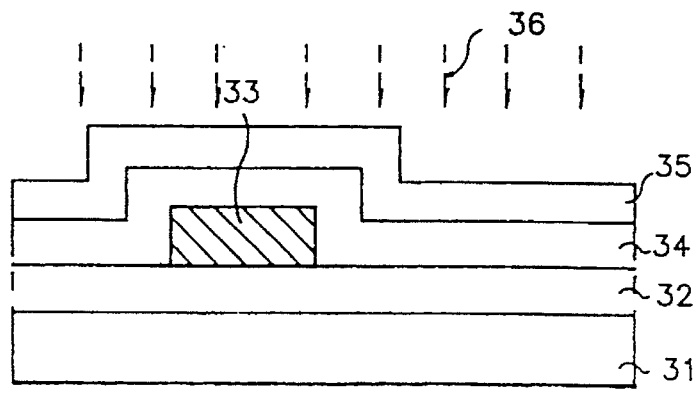
FIGS. 4A to 4E are sectional views explaining the process steps for making the TFT having a self-aligned diffused source/drain in accordance with the embodiment of the invention.

As shown in FIG. 4A, the substrate 31 has the insulating layer 32 such as oxide layer on which a layer of polysilicon 33 is deposited. The polysilicon layer 33 is then patterned to form a gate located in the central portion of the insulating layer 32.

Over the insulating layer 32 is formed a gate insulating layer 34 which fully covers the gate 33 and an undoped polysilicon layer is deposited to form a first semiconductor layer 35 on the gate insulating layer 34. To adjust the threshold voltage of the TFT, the impurity ions, indicated as reference numeral 36 in Figure, are implanted into the first semiconductor layer 35.

The procedures of forming the first semiconductor layer 35 include the steps of depositing a polysilicon layer 35, forming an amorphous silicon layer by implanting the silicon ions into the polysilicon layer 33 to improve the characteristics of the layer, and converting the amorphous silicon layer into the polysilicon layer by use of the anneal process.

The annealing may be performed by either a laser or an long thermal treatment above 5 hours at the temperature of 600°±50° C. and instead of the undoped polysilicon layer it may be used an undoped amorphous silicon layer as the first semiconductor layer 35.

The formed gate insulating layer 34 and first semiconductor layer 35 have the stepped portions by the patterned gate 33 in the thickness of it.

Figure 4B:
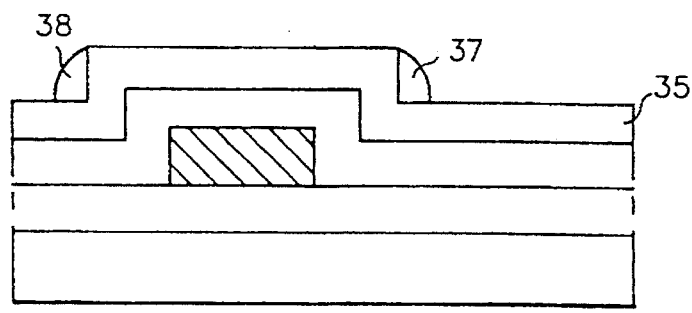

Referring to FIG. 4B, over the first semiconductor layer 35 an oxide layer, such as High Temperature Oxide(HTO), High Temperature Low Pressure Oxide(HLO) or Low Temperature Oxide(LTO), is deposited and then etched back to form the sidewall spacers 37,38 on the vertical surfaces of the stepped portion due to the gate 33.

Figure 4C:
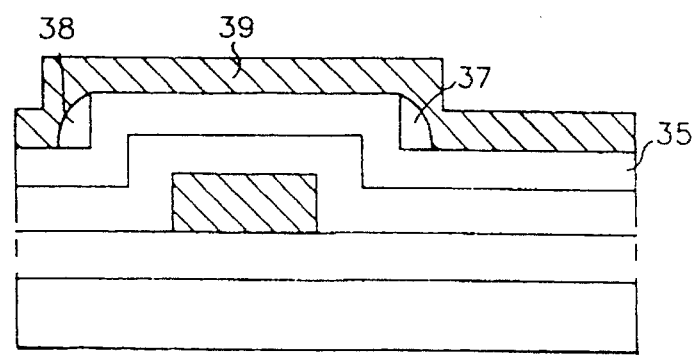

Next, as shown in FIG. 4C, a doped polysilicon layer 39 is deposited throughout the whole surface of the substrate.

The doped polysilicon layer 39 is formed either depositing a in situ doped polysilicon layer or implanting the impurity, for example, B+ or BF2+, into the deposited undoped polysilicon layer in advance.

Figure 4D:
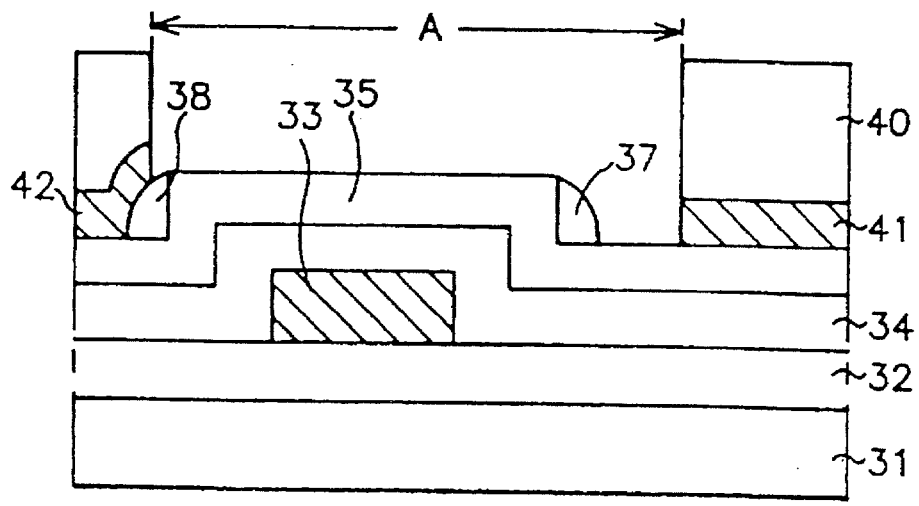

As shown in FIG. 4D, the coated photoresist film 40 on the doped polysilicon layer 39 is subjected to the photolithographic procedure which enables to make an opening A corresponding to a channel area and thereby to expose some portion of the doped polysilicon layer 39.

The photoresist film 40 acts as the etch mask which is used in selectively removing the doped polysilicon layer 39, thereby forming the second semiconductor layers 41, 42 disposed near both sides of the gate and formed over the first semiconductor layer 35, whereby the second semiconductor layer 42 near the one side of the gate is disposed over both surfaces of the first semiconductor layer 35 and sidewall spacer 38 and the second semiconductor layer 41 near the other side of the gate 33 only disposed over the surface of the first semiconductor layer 35 and is apart from the sidewall spacer 37 by a certain distance.

The second semiconductor layers 41, 42 may be made of the doped amorphous silicon layer instead of the doped polysilicon layer.

In the same way as the afore-described method of forming the doped polysilicon layer, the doped amorphous silicon layer is formed either depositing an in situ doped amorphous silicon layer or implanting the impurity into the deposited undoped amorphous silicon layer in advance. The sidewall spacers 37,38 made of oxide layer prevent it from leaving there the residue which can be created when the polysilicon layer 39 is etched.

Figure 4E:
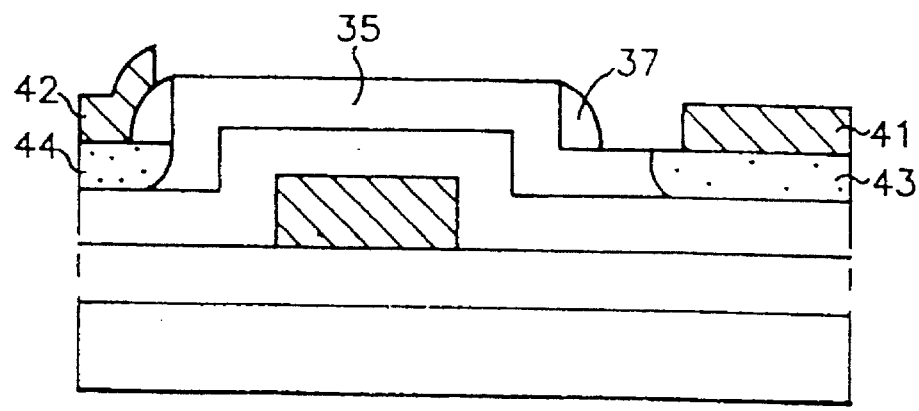

Referring to FIG. 4E, the diffusion process through the annealing is performed to form the source and drain regions 44, 43 in a self-aligned manner, in which the annealing allows the impurities doped in the second semiconductor layers 41,42 to diffuse into the underlying first semiconductor layer 35.

Since the second semiconductor layer 41, which serves as a diffusion source, is apart from the sidewall spacer 37 by the certain distance, correspondingly the drain area 43 is isolated from the sidewall spacer 37 by the constant distance, which is termed an off-set drain area.

Referring to FIG. 4E, except for the region (reference symbol A in FIG. 4D) in which the channel is formed, the lines by the source-and drain are identified with the first and second semiconductor layer 41,42 of which total thickness makes the reduction in the sheet resistance.

According to the present invention, the double layer of semiconductor result in the reduction of the sheet resistance due to the increase in the thickness of that layer, thereby improving the current driving capability. Therefore, it is obtained the effect of the reduced power consumption in the operation of the complete device.

Under the conditions that W/L is 0.6×1.2 μm, BF2+ ion is implanted at a dosage level of 5×10 ions/cm2 and an energy level of 25 Kev in the case of LDD and the BF2+ ion implantation is performed at a dosage level of 3×10 ions/cm2 and an energy level of 25 Kev in the case of the source/drain area of heavy concentration, the conventional LDO TFT takes the values of the off and on current of 515 fA and 103 nA, respectively, and a ratio of on to off current of 2×10, while the TFT of the invention has the values of the off and on current and a ratio of on to off current of 97 fA, 98 nA and 1.0×10, respectively.

In the evaluation of the average value associated with 75 points data, the on and off current of the conventional LDO TFT are 101 nA ($1\sigma=1.2\%$) and 518 fA ($1\sigma-1.8\%$), respectively, and a ratio of on to off current is 1.9×10, whereas the on and off current of the TFT of the invention are 98 nA ($1\sigma=1.7\%$) and 97 fA ($1\sigma=1.5\%$), respectively, and a ratio of on to off current is 9.8×10.

Figure 5:
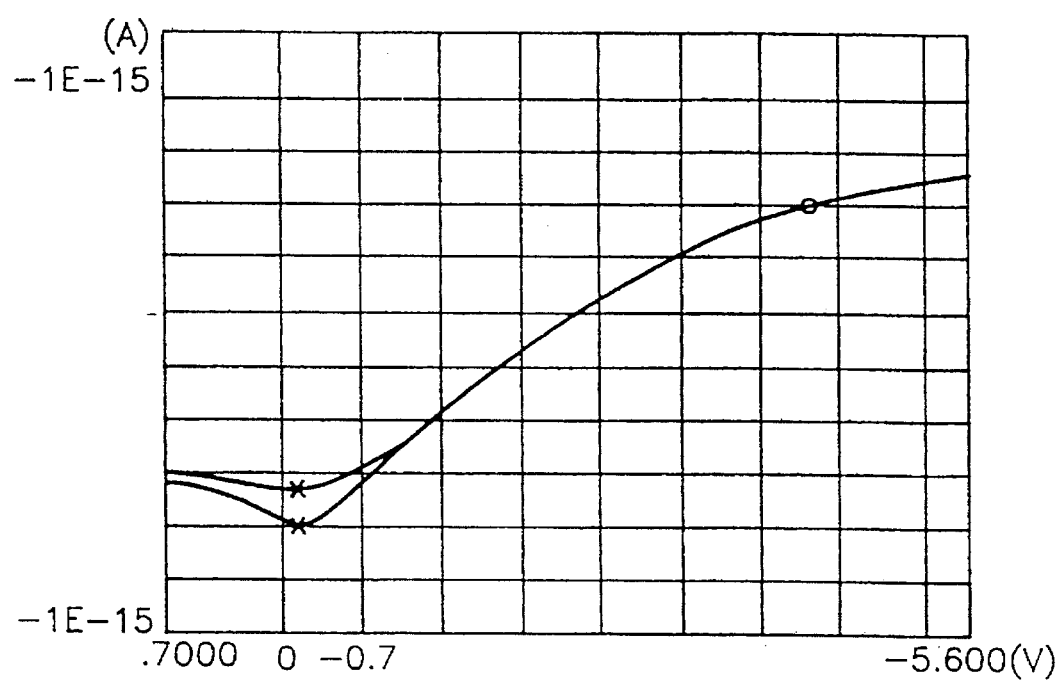
FIG. 5 is a graph showing the respective characteristics of this invention and conventional TFT.

FIG. 5 is a graph showing the respective current characteristics curves of this invention and conventional TFT.

In Figure, the mark 'O' and 'X' denote the on and off current points, respectively. The measured values say that although the on current of the invention is similar to that of the conventional LDO TFT, the off current is considerably different from the convention art.

Accordingly, while the respective on current points of this invention and prior art are plotted in drawing without a considerable difference, the respective off current points of this invention and prior art are plotted at the different positions from each other in drawing.

Therefore, the TFT having a self-aligned diffused source/drain has a small off current like the off-set TFT and a large on current like the LDO TFT, so the TFT of the invention has a higher ratio of on to off current above 5 times than that of the conventional TFT.

What is claimed is:

1. A thin film transistor (TFT) comprising:

a substrate;

a gate electrode formed on the substrate and having first and second sides;

a gate insulating layer formed over the substrate and covering the gate electrode;

a first semiconductor layer formed on the gate insulating layer, the first semiconductor layer having first and second sides adjacent the first and second sides, respectively, of the gate electrode;

first and second sidewall spacers formed on the first and second sides, respectively, of the first semiconductor layer;

first and second highly doped impurity regions formed in the first semiconductor layer adjacent the first and second sides, respectively, of the gate electrode, the first highly doped impurity region being spaced from the first sidewall spacer, and the second highly doped impurity region being overlapped by the second sidewall spacer; and second and third semiconductor layers the first semiconductor layer near both sides of the gate, the second semiconductor layer being formed over the first highly doped impurity region, and the third semiconductor layer being formed over the second highly doped impurity region and over the second sidewall spacer.

2. A TFT of claim 1, wherein the first semiconductor layer comprises undoped polysilicon.

3. A TFT of claim 1, wherein the first semiconductor layer comprises undoped amorphous silicon.

4. A TFT of claim 1, wherein the first and second sidewall spacers comprise one of HTO, HLO, and LTO.

5. A TFT of claim 1, wherein the second and third semiconductor layers comprise doped polysilicon.

6. A TFT of claim 1, wherein the second and third semiconductor layers comprise doped amorphous silicon.

7. A TFT of claim 1, further comprising an insulating layer formed on the substrate.

8. A TFT of claim 7, wherein the insulating layer comprises an oxide.

9. A TFT of claim 1, wherein the first and second highly doped impurity regions form a drain and a source, respectively, of the TFT.

10. A TFT of claim 9, wherein the second and third semiconductor layers provide diffusion sources for forming the drain and source, respectively.

11. A TFT of claim 1, wherein the first and second sidewall spacers prevent etch residue from residing on the first semiconductor layer and the first and second highly doped impurity regions during formation of the second and third semiconductor layers.

* * * * *

UNITED STATES PATENT AND TRADEMARK OFFICE
CERTIFICATE OF CORRECTION

PATENT NO. : 5,552,614
DATED : September 3, 1996
INVENTOR(S) : Sa Kyun RHA

It is certified that error appears in the above-indentified patent and that said Letters Patent is hereby corrected as shown below:

On the title page, item [54] and column 1, lines 1 and 2:
TITLE: "SELF-ALIGNED THIN FILM TRANSISTOR WITH SIDEWALL SPACERS" should read --THIN FILM TRANSISTOR--.

Column 6, lines 50-51, delete "the first semiconductor layer near both sides of the gate".

Signed and Sealed this

Second Day of September, 1997

Attest:

BRUCE LEHMAN

Attesting Officer

Commissioner of Patents and Trademarks